United States Patent [19]

Beasom

[11] Patent Number: 5,652,153

[45] Date of Patent: Jul. 29, 1997

[54] METHOD OF MAKING JFET STRUCTURES FOR SEMICONDUCTOR DEVICES WITH COMPLEMENTARY BIPOLAR TRANSISTORS

[75] Inventor: James D. Beasom, Melbourne Village, Fla.

[73] Assignee: Harris Corporation, Melbourne, Fla.

[21] Appl. No.: 543,754

[22] Filed: Oct. 16, 1995

Related U.S. Application Data

[63] Continuation of Ser. No. 279,024, Jul. 22, 1994, abandoned.

[51] Int. Cl.[6] .................................................. H01L 21/265
[52] U.S. Cl. .......................... 437/29; 437/31; 437/54; 437/76; 437/59; 148/DIG. 88
[58] Field of Search ........................ 437/59, 31, 34, 437/54, 55, 74, 76, 911, 29; 148/DIG. 88

[56] References Cited

U.S. PATENT DOCUMENTS

| | | | |
|---|---|---|---|
| 4,403,395 | 9/1983 | Curran | 437/55 |
| 4,553,318 | 11/1985 | Chandrasekhar | 437/55 |
| 4,729,008 | 3/1988 | Bearom | 257/273 |
| 4,939,099 | 7/1990 | Seacrist et al. | 437/47 |
| 5,151,765 | 9/1992 | Yamauchi | 257/553 |
| 5,296,409 | 3/1994 | Merrill et al. | 437/34 |

*Primary Examiner*—Tuan H. Nguyen
*Attorney, Agent, or Firm*—Rogers & Killeen

[57] ABSTRACT

A semiconductor device may include complementary NPN and PNP transistors and a JFET that is formed in the same steps as used to form the transistors. The bottom gate of the JFET and the back collector layer of the PNP transistor are doped and up-diffused in the same steps to cause the channel of the JFET and distance between the base and back collector layer of the PNP transistor to be the same. The JFET may have a low voltage capability (less than 5 volt pinch-off voltage) and the PNP transistor may have a breakdown voltage of at least 30 volts.

27 Claims, 2 Drawing Sheets

METHOD OF MAKING JFET STRUCTURES FOR SEMICONDUCTOR DEVICES WITH COMPLEMENTARY BIPOLAR TRANSISTORS

This is a continuation of application Ser. No. 08/279,024, filed Jul. 22, 1994, now abandoned.

BACKGROUND OF THE INVENTION

The present invention relates to semiconductor devices and methods off making semiconductor devices, and more particularly low voltage integrated circuit semiconductor devices and methods in which JFETs are formed in the same steps that are used to form complementary bipolar transistors.

Low voltage, integrated circuit semiconductor devices with bipolar transistors may desirably include JFETs to perform such functions as low input current and analog switching, and multiplexing. NJFETs are usually preferred because they provide higher transconductance and lower resistance than P type devices of comparable size due to the higher mobility of electrons than holes.

The manufacture of integrated circuit semiconductor devices involves a multiplicity of complex sides that are desirably combined or eliminated to reduce manufacturing cost and complexity. As is known, some steps in the manufacture of bipolar transistors for integrated circuits can be used to form parts of other components. Combined steps may be used to advantage to provide components that have particularly well matched operating characteristics. When PNP and NPN bipolar transistors are formed in the same steps, the process is known as a complementary bipolar process and the transistors so made are denominated complementary bipolar transistors. See, for example, U.S. Pat. No. 4,969,823 issued Nov. 13, 1990 to Lapham, et al. in which complementary bipolar transistors are formed by doping adjacent areas of a semiconductor substrate to form two areas of opposite conductivity type, growing an epitaxial layer on the substrate, and up-diffusing the dopant from the substrate into the epitaxial layer so as to create collector regions for complementary NPN and PNP transistors. However, there is no suggestion how the disclosed process may form a JFET at the same time.

Parts of relatively high voltage JFETs (pinch off voltages of more than 20 volts) have been formed in the same steps used to form complementary bipolar transistors, but the same steps have not been used to form low voltage JFETs for signal processing and analog switching applications that require a pinch off voltage of less than 5 volts. A 5 volt pinch-off voltage is about as large as can be used in signal processors and analog switches that use ±15 volts power supplies, in which signal swings are typically 5 volts from supply voltage. These low voltage JFETs have smaller, and more critical dimensions than high voltage JFETs. For example, U.S. Pat. No. 4,729,008 issued Mar. 1, 1988 to the inventor hereof, suggests that a high voltage JFET may have its source and drain, channel and a top gate formed in steps used to make complementary vertical bipolar transistors. However, it does not suggest how to use common steps when the JFET and transistors being formed have critical dimensions that do not match.

Of particular note are the conflicts between (a) the desired vertical distances in the collector of the transistors and the channel of the JFET, and (b) the doping levels therein. As will become apparent, these conflicts arise because the collectors of the transistors and channel of JFET are to be formed in the same steps.

An important characteristic of a JFET is its pinch-off voltage Vp. JFETs are designed to have a particular Vp that may vary within a specified range. Vp is determined by the doping level and the thickness of the channel between the top and bottom gates. For example, when the top and bottom gates are more heavily doped than the channel (so that the two gate-channel junctions can be modeled as one-sided step junctions), pinch-off voltage is:

$$V_P = \{[qN_D(0.5t)^2]/(2\epsilon_{Si}\epsilon_0)\} - \Phi_B \tag{1}$$

where, q is electron charge, $N_D$ is channel doping concentration, t is channel thickness, $\epsilon_{Si}$ is relative dielectric constant of silicon, $\epsilon_0$ is dielectric constant of free space, $\Phi_B$ is the PN junction built-in voltage.

For pinch-off voltages of less than 5 volts, the sensitivity to changes in channel doping and thickness is apparent. For example, if channel doping is too high, the channel thickness will need to be too thin to be manufacturable using current techniques.

This sensitivity is particularly vexing because channel doping and thickness vary during manufacture and are very difficult to control to the precision needed. Recent developments in semiconductor device manufacturing methods permit channel doping to be controlled to within about ±10% and channel thickness to within about ±5% for epitaxially grown channels.

There are also operational characteristics of bipolar transistors that should be considered when JFETs are to be made in the same steps. It is particularly desirable to reduce transistor collector resistance and to achieve a desired breakdown voltage, usually Bvceo. These characteristics may be controlled by controlling the vertical distance between the bottom of the transistor base and the heavily doped part of the lower collector layer. This distance should be large enough so that a depletion layer that extends down from the base when the transistor is operating does not contact the lower collector layer before the desired breakdown voltage is achieved. However, because collector resistance increases as this distance increases, the distance desirably is not much greater than that needed for the desired breakdown voltage in order to minimize collector resistance.

Thus, the vertical distances defining the channel thickness and the distance between base and lower collector layer are to be specifically set, and since they are to be formed in the same steps (as will be discussed below) are desirably the same. Further, the doping levels in these areas are also to be specifically set in the same steps and thus are also desirably the same. These objectives have not been achieved in the prior art.

Accordingly, it is an object of the present invention to provide a novel semiconductor device with a JFET and complementary bipolar transistors and method of making the device that obviate the problems of the prior art.

It is another object of the present invention to provide a novel semiconductor device with a JFET and complementary bipolar transistors and method of making the device in which the bottom gate of the of the JFET and the lower collector layer are formed in the same steps.

It is yet another object of the present invention to provide a novel semiconductor device with a JFET and complementary bipolar transistors formed in the same steps in which the pinch-off voltage of the JFET and breakdown voltage of the transistors are sufficient for low voltage operation.

It is still another object of the present invention to provide a novel semiconductor device with a JFET and complementary bipolar transistors formed in the same steps in which the distances between base and lower collector layer in the two transistors are separately controllable, with one of the distances being the same as the channel thickness in the JFET.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
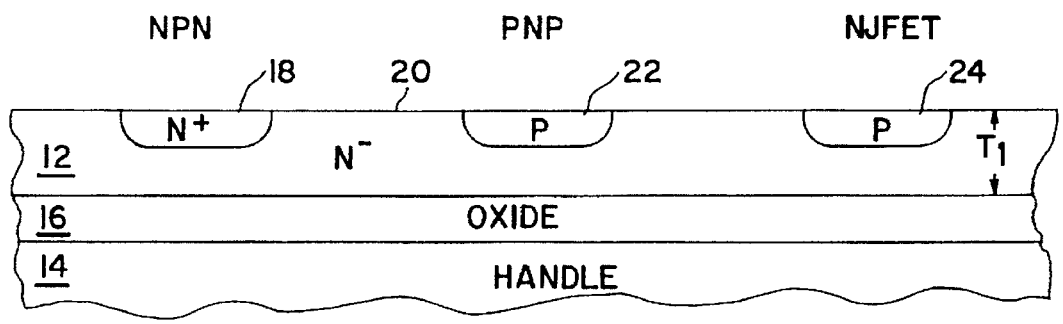
FIGS. 1, 2, and 3 are partial vertical cross sections of an embodiment of the present invention illustrating stages in the manufacture thereof.
Figure 2:
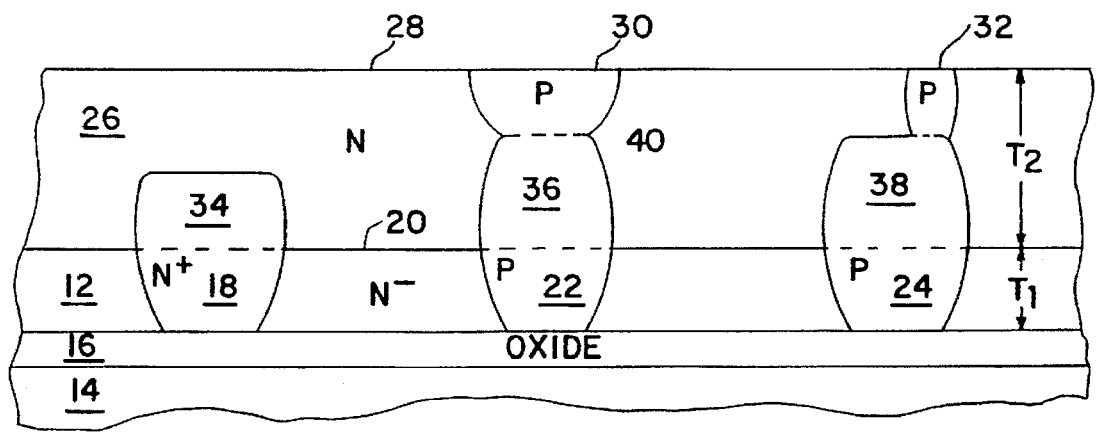
Figure 3:
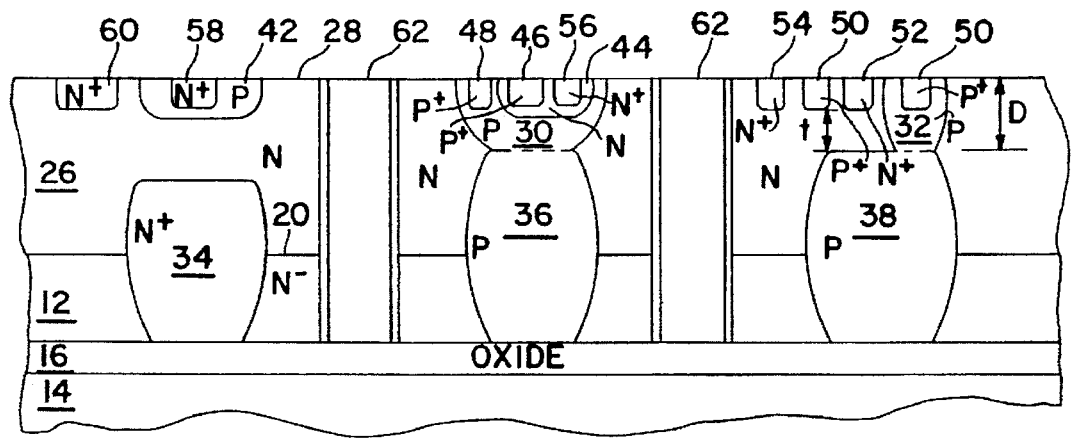

With reference now to FIGS. 1–3, a semiconductor device may include complementary NPN and PNP transistors and a JFET. An N type JFET is shown, although a P type JFET may be provided instead of, or in addition to, the NJFET.

An N or P type wafer 12 may be attached (e.g., with a conventional oxide to oxide bond) to a handle wafer 14 overlain with an oxide layer 16. The thickness T1 of the wafer 12 may be reduced as appropriate. Part of a more heavily doped buried layer for the NPN transistor may be implanted by patterning and doping a region 18 in joining surface 20. Parts of the more heavily doped lower (or back) collector layer for the PNP transistor, and of the bottom gate for the JFET may be implanted by patterning and doping regions 22 and 24 in the same steps. (The terms "front" and "back" respectively refer to the top and bottom of the semiconductor device as shown in the vertical cross section of FIG. 3.) The patterning and doping may be carried out conventionally.

After the dopants have been implanted in wafer 12, a layer 26 may be epitaxially grown on joining surface 20. The thickness T2 and resistivity of the epitaxial layer may be set as appropriate. A front collector layer for the PNP transistor, and a bottom gate contact for the JFET may be implanted into the top surface 28 of the epitaxial layer by patterning front collector layer 30 and front contact layer 32 in the same steps. In the same steps that the dopant for layers 30 and 32 is being diffused into the epitaxial layer 28, the dopant from regions 18, 22, and 24 is being up-diffused from the surface 20 into the epitaxial layer 26 to form NPN buried layer 34, PNP back collector layer 36, and JFET bottom gate 38. The up-diffusing region 24 joins the down-diffusing front contact layer 32 to provide a contact for the JFET bottom gate 38 from the surface 28, and the up-diffusing region 22 joins the down-diffusing front collector layer 30 to form PNP collector 40 with more heavily doped back collector layer 36. The back collector layer 36 and the front collector layer 30 should overlap for the entire range of thicknesses of the epitaxial layer 26, and yet the back collector should not be close enough to the top surface of the epitaxial layer to reduce breakdown voltage as discussed above. In a preferred embodiment, the front collector layer 30 has an integrated doping of about $7 \times 10^{12}$ ions per square centimeter and a maximum concentration of about $1 \times 10^{16}$ ions per cubic centimeter at the epitaxial surface from which the diffusion is made, and the back collector layer 36 has an integrated doping of about $3.5 \times 10^{13}$ ions per square centimeter and a maximum concentration of about $7 \times 10^{13}$ ions per cubic centimeter at the bottom of the epitaxial layer.

Thereafter, the further elements of the transistors and the JFET may be implanted into the surface 28. The P type base 42 for the NPN transistor and the N type base 44 for the PNP may be patterned and doped. Following this, the P+ PNP emitter 46 and collector contact 48 may be similarly provided. A top gate 50 for the JFET is preferably provided in the same steps when other elements of similar conductivity type are formed. For an NJFET, the N+ source 52 and drain 54, N+ base contact 56 for the PNP, and the N+ emitter 58 and collector contact 60 for the NPN may be patterned and doped, preferably in the same step.

The PNP and NPN transistors and the JFET may be electrically isolated as required. For example, they may isolated using conventional trenches 62 formed at any appropriate stage of the fabrication process after growth of the epitaxial layer 26, preferably before the front P diffusion of layers 30 and 32. Alternatively, they may be junction isolated using conventional methods (not shown).

In a preferred embodiment the pinch-off voltage is less than 5 volts and the breakdown voltage Bvceo is at least 30 volts. To this end, T1 may be about 5 microns and T2 about 15 microns (14.75 microns ±5%). The doping concentration of the epitaxial layer 26 may be about $1 \times 10^{15}$ ions per cubic centimeter, so that resistivity is about 4 ohm-centimeters (±10%). To achieve a 30 volt BVceo in the PNP transistor the up-diffusing more heavily doped back collector layer 36 should not get closer than about 5.5 microns to the surface 28 (the PNP base 44 is desirably about 3 microns thick). However, to achieve a less than 5 volt pinch-off voltage in the JFET the up-diffusing bottom gate 38 should get no closer than about 5.1 microns to the surface 28 (distance D in FIG. 3). As these up-diffusions are desirably carried out in the same step, one of the distances will be effected. This conflict can be resolved by reducing the dopant concentration of the back collector layer 36 to about $3.5 \times 10^{13}$ ions per square centimeter and allowing the up-diffusing dopant to rise to 5.1 microns from surface 28. Assuming that the top gate 50 is about 1.5 microns thick, the JFET channel between the top gate 50 and the bottom gate 38 has a thickness t of about 3.65 microns. The pinch-off voltage for this channel thickness and doping level is between about 1.0 V and 3.6 V. To obtain the BVceo of the PNP transistor, its HFE should also be known. HFE may be set to any desired value (e.g., 100 in the above-described embodiment) by controlling the active base doping of the PNP to the appropriate value using techniques known in the art.

The trench isolation technique illustrated in FIG. 3 is preferred when the dopant concentration is reduced to about $3.5 \times 10^{13}$ ions per square centimeter. Junction isolation techniques may need a higher dopant concentration (e.g., on the order of $1 \times 10^{15}$ ions per square centimeter) to suppress parasitic transistors that can cause latch up. The trench isolation and bottom oxide isolation illustrated eliminate the parasitic devices that can arise from the isolating PN junctions, thus eliminating latch up without constraining dopant concentration.

In some devices it may be desirable to provide an NPN transistor with a more heavily doped buried layer 34 that is not as close to the base 42 as the back collector layer 36 is to the base 44 in the PNP transistor. A greater separation may be needed in the NPN to achieve an acceptable breakdown voltage. This may be particularly difficult in the event a lower dopant concentration is used in the back collector layer 36 as a longer diffusion time will be needed. The up-diffusing distance of the buried layer 34 may be reduced by using an N+ type dopant that has a lower diffusion coefficient than the P type dopant used in the back collector layer 36. For example, the N+ type dopant may be arsenic or antimony and the P type dopant may be boron.

Figure 4:
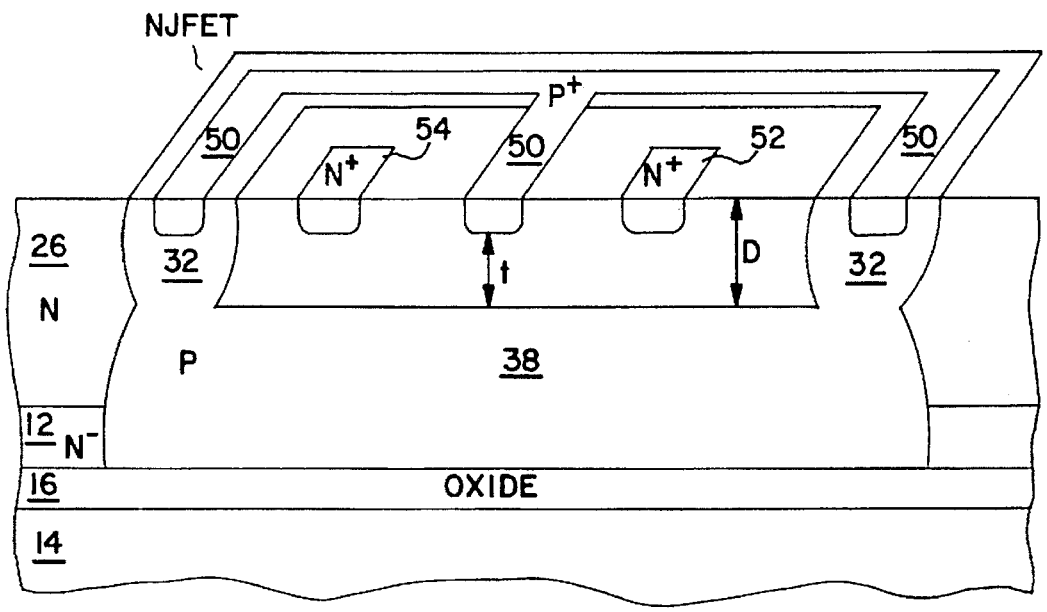
FIG. 4 is a cutaway view of an embodiment of a JFET of the present invention illustrating an optional top gate alignment.
Figure 5:
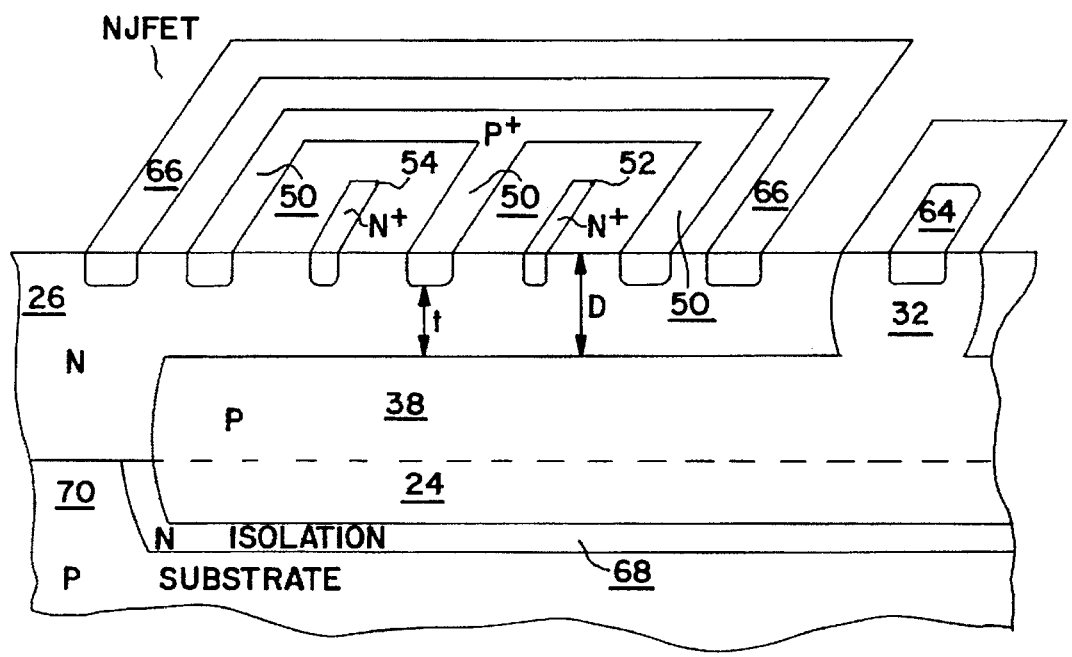
FIG. 5 is a cutaway view of a further embodiment of a JFET of the present invention illustrating an another top gate alignment, and another embodiment of the bottom gate and substrate.

With reference now to FIGS. 4 and 5, several options for alignment of the JFET top gate are available. (The element numbers of FIGS. 1–3 have been used on similar elements in the interest of clarity.) In FIG. 4 the top gate 50 overlaps the bottom gate contact 32 to tie the two gates together. The P+ top gate 50 runs inside the P bottom gate contact 32 around the periphery of an NJFET to provide channel stopping to protect against MOS inversion of the surface of the contact 32.

In FIG. 5 the top gate 50 is isolated from the bottom gate 38 so that the two gates may be independently biased. The top gate 50 surrounds source 52 and drain 54 so that there is no path from either that does not pass between top and bottom gates. Optionally, a P+ bottom gate contact region 64 in the contact 32, and an N+ channel stop ring 66 between the top gate 50 and the bottom gate contact 32 may be provided.

In an alternative embodiment, a junction isolated, non-bonded process may be used with a P type substrate. As illustrated in the bottom portion of FIG. 5, an N isolation layer 68 may be diffused into a P substrate 70 prior to growth of the epitaxial layer 26. The region 24 and JFET bottom gate 38 may be formed as discussed above.

In further alternatives, the characteristics of the JFET may be modified to optimize parameters for a particular application. This may be useful when several JFETs with different characteristics are to be provided. For example, the doping of the bottom gate may be more tightly controlled by setting the doping with a non-selective P type implant before the NPN N+ buried layer and PNP back collector layer are formed. The non-selective P type dopant should have a low enough doping level (e.g., $1-2\times10^{12}$ ions per square centimeter) so that it does not convert the subsequently formed N+ buried layer to P type and so that it does not change the doping profile of the upper part of the back collector layer after it has been up-diffused. The bottom gate of the JFET may be formed in a special diffusion step optimized to make the bottom gate, or the bottom gate diffusion may be avoided if the wafer 12 is P type.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of making a JFET with top and bottom gates in a bipolar process by which complementary NPN and PNP transistors are made in a semiconductor device, comprising the steps of doping and up-diffusing a bottom gate of the first conductivity type for the JFET in the same steps by which a back collector layer of the first conductivity type is doped and up-diffused in one of the NPN and PNP transistors, the doping of the bottom gate and the back collector layer having a maximum of about $7\times10^{16}$ cm$^{-3}$.

2. The method of claim 1 wherein the step of up-diffusing the bottom gate of the JFET comprises the step of up-diffusing the bottom gate so that a channel between the JFET top gate and the JFET bottom gate has a width whereby JFET pinch-off voltage is less than 5 volts.

3. The method of claim 2 further comprising the step of doping the bottom gate with a higher dopant concentration than the channel.

4. The method of claim 1 wherein the steps of doping and up-diffusing the back collector layer comprise the steps of doping the back collector layer to a level so that breakdown voltage will not be effected when a depletion layer extending from a base of the transistor contacts the back collector layer when the transistor is operating, and up-diffusing the back collector layer a first distance from a top surface of the transistor so that the depletion layer does not extend substantially into the back collector layer when the transistor is operating.

5. The method of claim 4 wherein the step of up-diffusing the bottom gate of the JFET comprises the step of up-diffusing the bottom gate the first distance so that a channel between the JFET top gate and the JFET bottom gate has a width whereby JFET pinch-off voltage is less than 5 volts.

6. The method of claim 5 wherein the back collector layer is doped to a concentration of $3.5\times10^{13}$ ions per square centimeter, plus or minus ten percent, and wherein the first distance is 5.1 microns, plus or minus 5 percent.

7. The method of claim 5 wherein the one transistor is a PNP transistor with a BVceo of at least about 30 volts.

8. The method of claim 1 wherein the doping of the bottom gate and the back collector is sufficiently light to permit penetration of the back collector layer of said one of the NPN and PNP transistors by the collector depletion layer of one of the NPN and PNP transistors.

9. The method of claim 1 wherein penetration of the collector depletion layer of said one of the NPN and PNP transistors is not less than about 0.4 microns when the semiconductor device has a voltage equal to its BVceo applied to base-collector junction.

10. The method of claim 1 further comprising the step of forming a contact for the bottom gate in the same steps by which a front collector layer for the one transistor is formed.

11. The method of claim 10 further comprising the step of horizontally separating the contact for the bottom gate from the top gate.

12. The method of claim 1 wherein the BVceo of the PNP transistor is not less than about 30 volts.

13. A method of making a JFET with top and bottom gates in a complementary bipolar process by which complementary NPN and PNP transistors are made in a semiconductor device, comprising the steps of doping and up-diffusing a bottom gate of the first conductivity type for the JFET in the same steps by which a back collector layer of the first conductivity type is doped and up-diffused in one of the NPN and PNP transistors, and further comprising the steps of up-diffusing the back collector layer of the one transistor and the bottom gate of the JFET a first distance, and up-diffusing a buried layer of the second conductivity type of the other of the NPN and PNP transistors a second distance less than said first distance.

14. The method of claim 13 wherein the dopant for the first conductivity types has a higher diffusion coefficient than the dopant for the second conductivity type.

15. The method of claim 14 wherein the first conductivity type is P and the dopant therefor is boron, the dopant for the second conductivity type is either arsenic or antimony.

16. A method of making a JFET with top and bottom gates in a complementary bipolar process by which complementary NPN and PNP transistors are made in a semiconductor device, comprising the steps of:

(a) doping and up-diffusing a bottom gate of the first conductivity type for the JFET in the same steps by which a back collector layer of the first conductivity type is doped and up-diffused in one of the NPN and PNP transistors;

(c) forming a contact for the bottom gate in the same steps by which a front collector layer for the one transistor is formed;

(d) forming a top gate surrounding the drain and source contacts of the JFET; and (e) providing a channel stop between the contact for the bottom gate and the top gate.

17. The method of claim 16 wherein the step of doping the back collector layer is part of formation of the PNP transistor and wherein the back collector layer is doped to a level so that the PNP transistor BVceo is at least about 30 volts.

18. A method of making an NJFET in a complementary bipolar process in which an NPN and a PNP transistor are formed in a semiconductor device, the method comprising the steps of:

(a) providing in a first surface of a semiconductor wafer, (i) an N type buried layer for the NPN transistor, (ii) a P type back collector layer for the PNP transistor doped to a maximum of about $7 \times 10^{16}$ cm$^{-3}$ and (iii) a P type bottom gate for the NJFET doped to a maximum of about $7 \times 10^{16}$ cm;

(b) growing an N type epitaxial layer on the first surface of the wafer;

(c) doping a front P type collector layer for the PNP transistor in a top surface of the grown epitaxial layer and diffusing the dopant so that the down diffusing front collector layer and the up diffusing back collector layer from the wafer merge to form a collector for the PNP transistor;

(d) doping a P type contact region for the NJFET bottom gate in the top surface of the epitaxial layer and diffusing the dopant so that the down diffusing contact region and the up diffusing bottom gate from the wafer merge to provide a contact for the bottom gate;

(e) doping a P type base for the NPN transistor and an N type base for the PNP transistor in the top surface of the epitaxial layer;

(f) doping an N type emitter for the NPN transistor and a P type emitter for the PNP transistor in the top surface of the epitaxial layer; and (g) doping a P type top gate for the NJFET in the top surface of the epitaxial layer, the top gate having a portion spaced from the bottom gate to form an N type channel therebetween, wherein at least one of the steps of doping the NJFET P type top gate and the NJFET P type bottom gate is carried out in the same step in which a P type region in the NPN or PNP transistor is doped.

19. The method of claim 18 wherein the step of doping the P type base of the NPN transistor, and the step of doping the P type top gate of the NJFET are carried out in the same step.

20. The method of claim 18 wherein the step of doping the front P type layer for the PNP transistor, and the step of doping the P type contact for the NJFET bottom gate are carried out in the same step.

21. The method of claim 18 wherein the step of doping the P type emitter of the PNP transistor, and the step of doping the P type top gate of the NJFET are carried out in the same step.

22. The method of claim 18 wherein the steps of providing the P type back collector layer for the PNP transistor and the P type bottom gate for the NJFET are carried out in the same step.

23. The method of claim 18 further comprising the step of doping the bottom gate more heavily than the channel.

24. The method of claim 18 wherein the doping of the bottom gate and the back collector layers is sufficiently light to permit penetration of the back collector layer of said PNP transistor by the collector depletion layer of the PNP transistor.

25. The method of claim 18 wherein penetration of the collector depletion layer of one of the NPN and PNP transistors is not less that about 0.4 microns when the semiconductor device has a voltage equal to its BVceo applied to base-collector junction.

26. A method of making an PJFET in a complementary bipolar process in which an NPN and a PNP transistor are formed in a semiconductor device, the method comprising the steps of:

(a) providing in a first surface of a semiconductor wafer, (i) a P type buried layer for the PNP transistor, (ii) an N type back collector layer for the NPN transistor doped to a maximum of about $7 \times 10^{16}$ cm$^{-3}$, and (iii) an N type bottom gate doped to a maximum of about $7 \times 10^{16}$ cm$^{-3}$ for the PJFET;

(b) growing a P type epitaxial layer on the first surface of the wafer;

(c) doping a front N type collector layer for the NPN transistor in a top surface of the grown epitaxial layer and diffusing the dopant so that the down diffusing front collector layer and the up diffusing back collector layer from the wafer merge to form a collector for the NPN transistor;

(d) doping an N type contact region for the PJFET bottom gate in the top surface of the epitaxial layer and diffusing the dopant so that the down diffusing contact region and the up diffusing bottom gate from the wafer merge to provide a contact for the bottom gate;

(e) doping an N type base for the PNP transistor and a P type base for the NPN transistor in the top surface of the epitaxial layer;

(f) doping a P type emitter for the PNP transistor and an N type emitter for the NPN transistor in the top surface of the epitaxial layer;

(g) doping an N type top gate for the PJFET in the top surface of the epitaxial layer, the top gate having a portion spaced from the bottom gate to form an P type channel therebetween, wherein at least one of the steps of doping the PJFET N type top gate and the PJFET N type bottom gate is carried out in the same step in which a N type region in the PNP or NPN transistor is doped and diffused.

27. The method of claim 26 wherein the doping of the bottom gate and the back collector layers is sufficiently light to permit penetration of the back collector layer of said NPN transistor by the collector depletion layer of the NPN transistor.

* * * * *